(12) United States Patent
Keeven et al.

(10) Patent No.: US 7,913,383 B1
(45) Date of Patent: Mar. 29, 2011

(54) MANUFACTURE OF WATERPROOF WIRE CONNECTORS

(75) Inventors: James C. Keeven, O'Fallon, MO (US); Lloyd Herbert King, Jr., Chesterfield, MO (US)

(73) Assignee: The Patent Store LLC, O'Fallon, MO (US)

( * ) Notice: Subject to any disclaimer, the term of this patent is extended or adjusted under 35 U.S.C. 154(b) by 443 days.

(21) Appl. No.: 12/148,810

(22) Filed: Apr. 23, 2008

(51) Int. Cl.
*H01K 3/10* (2006.01)
*B05D 3/02* (2006.01)

(52) U.S. Cl. ............... 29/855; 29/841; 29/858; 29/883; 29/832; 427/226

(58) Field of Classification Search ............... 29/855, 29/841, 868, 829, 870, 858, 567; 427/226, 427/387, 397.7, 397.8, 388.1, 388.2, 388.3, 427/388.4, 388.5; 174/76, 87, 92
See application file for complete search history.

(56) References Cited

U.S. PATENT DOCUMENTS

| | | | | |
|---|---|---|---|---|
| 4,863,535 A | * | 9/1989 | More | 156/49 |
| 5,456,791 A | * | 10/1995 | Ueno | 156/556 |
| 5,672,846 A | * | 9/1997 | Marie-Louise Debbaut | 174/84 R |
| 6,488,880 B2 | * | 12/2002 | Le et al. | 264/267 |
| 2006/0131704 A1 | * | 6/2006 | Carberry et al. | 257/668 |

* cited by examiner

*Primary Examiner* — Derris H Banks
*Assistant Examiner* — Tai Nguyen
(74) *Attorney, Agent, or Firm* — Jacobson & Johnson

(57) ABSTRACT

A method of manufacturing gel containing wire connectors with a silicone gel that remains in an unseparated state wherein the temperature of the gel precursors are elevated before being mixed and dispensed into the cavity of a wire connector where the mixed gel precursors are allowed to cool and cure without the necessity of additional heating of either the mixed gel precursors or the wire connector.

15 Claims, 2 Drawing Sheets

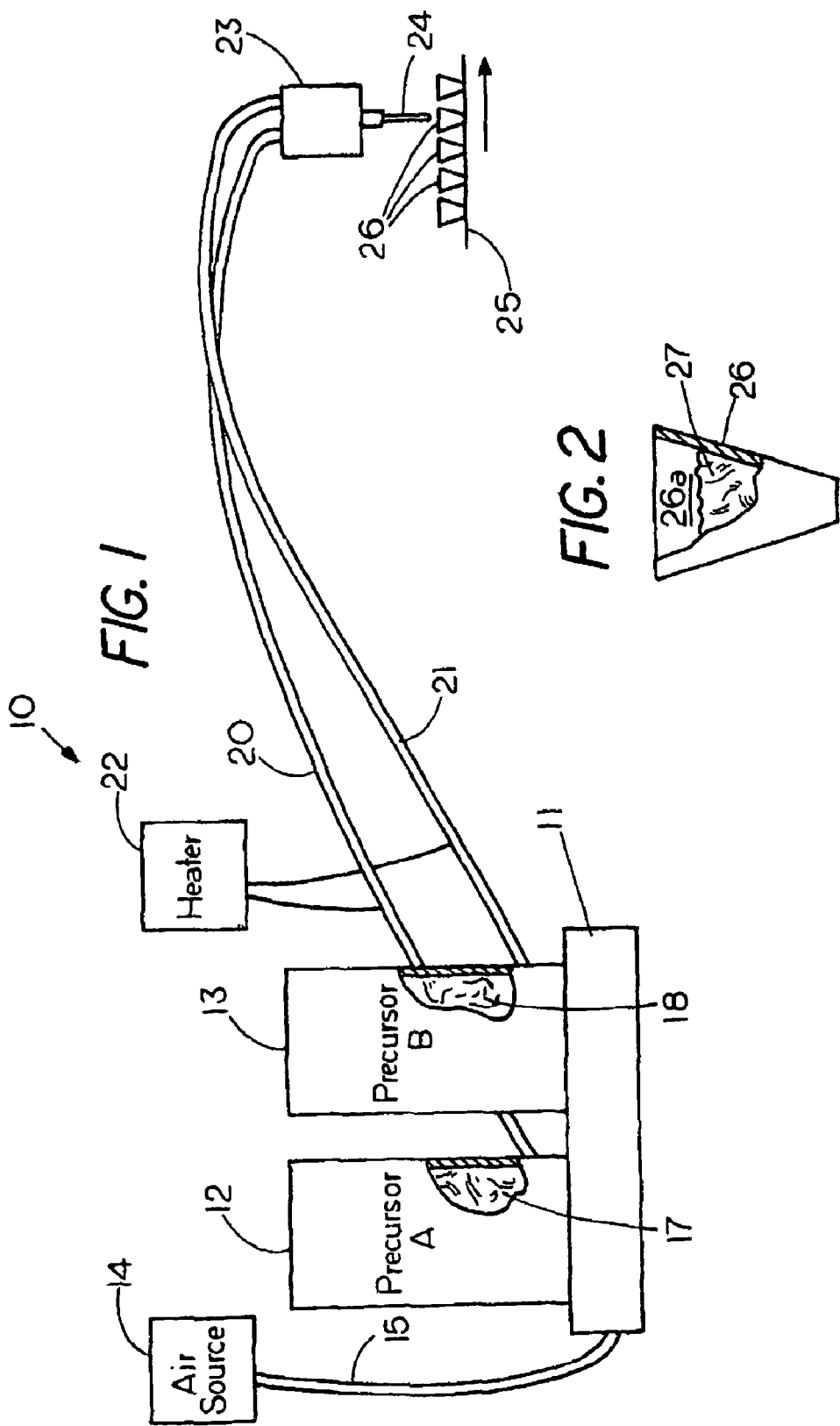

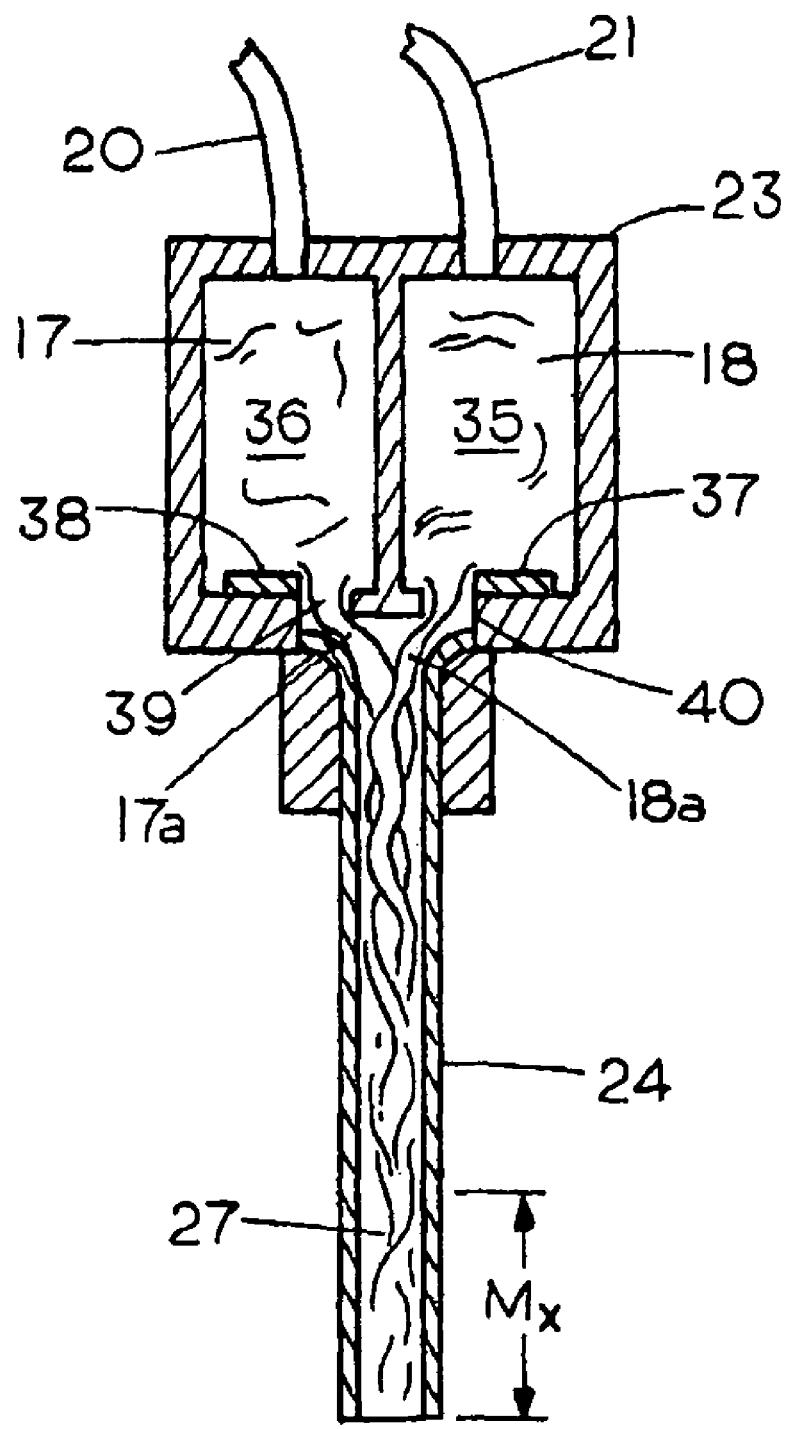

MANUFACTURE OF WATERPROOF WIRE CONNECTORS

FIELD OF THE INVENTION

This invention relates generally to manufacturing waterproof wire connectors and, more specifically, to a process and apparatus for manufacturing wire connectors with cured gels.

CROSS REFERENCE TO RELATED APPLICATIONS

None

STATEMENT REGARDING FEDERALLY SPONSORED RESEARCH OR DEVELOPMENT

None

REFERENCE TO A MICROFICHE APPENDIX

None

BACKGROUND OF THE INVENTION

The concept of using a viscous sealant such as a silicone in a wire connector to waterproof the wire connector is known in the art. Examples of use of viscous sealants in twist-on wire connectors is shown in King U.S. Pat. No. 5,113,037. Other types of silicones such as silicone gels, which cure to a soft gel like consistency are used for protecting extremely delicate electronic components from shock and vibration as well as waterproofing the encapsulated components. Generally, the silicone gels have a tacky surface and form a mechanical bond to most surfaces making them ideal for vibration protection. The viscous sealants, which remain in a viscous state, require no curing phase and can be injected directly into a wire connector while the conventional method of creating gels, which are made from mixing two components, require a curing phase that requires additional handling and processing.

The known process for formation of the silicone gels includes the mixing of a first silicone gel precursor with a second silicone gel precursor and then curing the gel mixture at an elevated temperature for a period of time. Typically, the gel mixtures are cured by heating the gel mixture and maintaining the gel mixture at temperatures ranging from 25° C. to 150° C. at times ranging from 5 minutes to 24 hours. Generally, the shorter cure times are used with gel mixtures that are cured at higher temperatures and the longer cure times are used with gel mixtures that are cured at lower temperatures which can require a separate or isolated curing of the product and the gel. Also when a silicone gel mixture is used in small amounts, for example in wire connectors such as twist-on wire connectors, oftentimes the silicone gel mixture may not cure properly. Another difficulty in manufacturing wire connectors with gels is that curing the gel mixture by heating the wire connector and the gel mixture renders the manufacturing process more difficult and more costly. Another manufacturing difficulty is that it has been found that when small amounts of a gel mixture are cured by the prior art proscribed curing process separation of the cured gel mixture can occur which leaves an oily film on the cured gel mixture oftentimes making it unacceptable for use in wire connectors.

SUMMARY OF THE INVENTION

A method and apparatus for manufacturing gel filled wire connectors where the wire connector remains at room temperature and the gel mixture in the wire connector cures to an unseparated state through a process of elevating the temperature of the gel precursors before dispensing the mixed gel precursors into the cavity of a wire connector, which can remain at room temperature, as the mixed gel precursors are allowed to cool and self cure in the wire connector.

BRIEF DESCRIPTION OF THE DRAWINGS

FIG. 1 is a schematic of a system for dispensing gel precursors into the cavity of a wire connector;

FIG. 2 is a partial sectional view of a twist on wire connector; and

FIG. 3 is a sectional view of the needle nozzle.

DESCRIPTION OF THE PREFERRED EMBODIMENT

FIG. 1 is a partial schematic of a system 10 for dispensing a mixed heated silicone gel precursor into the cavity of a wire connector to form a wire connector with a gel therein without having to separately cure the gel in the wire connector. System 10 includes a base member 11 that supports a container 12 containing a first silicone gel precursor 17 and a container 13 that contains a second silicone gel precursor 18. A source of compressed air 14 connects to base 11 to allow the container 12 to be pressurized and thereby cause the gel precursor 17 in container 12 to flow through hose 20. Similarly, the source of compressed air 14 allows container 13 to be pressurized to cause the gel precursor 18 in container 13 to flow through hose 21. Silicone gels that are formed from two or more separate gel precursors are commercially available from various United States suppliers.

System 10 includes a first heat transfer member 20 for simultaneously heating and transferring the gel precursor in container 12 to an unheated dispensing valve 23. Heat transfer member 20 provides on the go heating of the first gel precursor 17 and may for example comprise a heated hose 20 that extends between container 12 and dispensing valve 23. Similarly, heat transfer member 21 provides for simultaneously heating and transferring the gel precursor in container 13 to a dispensing valve 23. Heat transfer member 21 provides for on the go heating of the second gel precursor 18 and may for example also comprise a heated hose 21 that extends between container 13 and dispensing valve 23. In the example shown heat transfer member 20 provides on the go heating of gel precursor 17 as the gel precursor travels from container 12 to dispensing valve 23 and similarly, heat transfer member 21 provides for on the go heating of gel precursor 18 as the gel travels from container 13 to dispensing valve 23 although other methods and means of heating the gel precursors may be used which do not use on the go heating. An example of heat transfer members suitable for use herein are heated hoses which are commercially available from suppliers of hoses and can include a resistance heater located along the length of the hose.

The dispensing valve 23, which receives the heated gel precursors 17 and 18 is shown in section in FIG. 3 and includes a first chamber 36 containing gel precursor 17 and a second chamber 35 containing gel precursor 18. A remote controlled shut off valve 38 at the bottom of chamber 36 allows one to open and close port 39 to thereby control the delivery of precursor 17 to the needle nozzle 24. Similarly, a remote controlled shut off valve 37 at the bottom of chamber 35 allows one to open and close port 40 to thereby control the delivery of precursor 18 to needle nozzle 24. Shut off valves 37 and 38 are remotely controlled by means such as by solenoids or the like (not shown).

FIG. 3 illustrates that the precursor 18 exits port 40 as a cylindrical strand 18a and that precursor 17 similarly exits port 39 as a cylindrical strand 17a. As the stands proceeds down the needle nozzle 14 mixing occurs. When the precursor 17 and precursor 18 reach the terminus end of the needle nozzle (designated by $M_x$) the precursor 17 and precursor 18 are mixed to form the mixed gel precursor 27 that is injected into a wire connector.

As can be seen in FIG. 1-FIG. 3, the heated gel precursor 17 in hose 20 and the heated gel precursor 18 in hose 21 are mixed in needle nozzle 24 immediately prior to dispensing from needle nozzle 24 to form a heated mixed gel precursor 27. The heated mixed gel precursor 27 is then dispensed directly into a cavity or chamber in a wire connector 26 as illustrated in FIG. 1. As can be seen from the above the gel precursors while heated above room temperature are kept in a heated and separate state until immediately prior to injection into the cavity of the wire connector.

In operation of the manufacturing system 10 a plurality of wire connectors, such as twist on wire connectors 26, are held in an upright position on a moving support such as a conveyor 25 that moves wire connector 26 beneath the nozzle 24 so that the wire connector 26 is in a position to receive a charge of the heated mixed gel precursor 27 from nozzle 24. Typically, the dispensing valve 23 is set for intermittent dispensing of the mixed gel precursor 27 by a controller (not shown) which opens and closes valves 37 and 38. That is, the nozzle 24 dispenses a charge of heated mixed gel precursor when wire connector 26 is located in a charge position beneath the needle nozzle 24 and suspends or interrupts dispensing to simultaneously allow the gel filled wire connector to move away from the charge position beneath nozzle 24 while an empty wire connector is moved to a charge or gel receiving position below needle nozzle 24. In the embodiment shown the wire connectors 26 are twist on wire connectors having an open top and a spiral coil in the connector for engaging and securing wires therein. Although twist on wire connectors are shown other types of wire connectors may be filled by the apparatus and method of the present invention. In the system 10 the mixed heated gel precursor 27 is dispensed directly into the cavity of the twist on wire connectors 26 and cures in the wire connector which can remain at room temperature (typically about 20° C.), thus eliminating the need to heat the wire connectors or allow excessive time for an ambient cure that disrupts a normal manufacturing process. The process as described has been found to eliminate gel separation that can occur when a gel mixture is cured by the gel manufactures proscribed process. While needle nozzles are described herein other types of dispensers of nozzles that can mix the gel precursors may also be used.

FIG. 2 is a partial sectional view of a twist on wire connector 26 revealing a cavity or chamber 26a in the twist on wire connector 26 with the heated mixed gel precursor 27 therein. Although a twist on wire connector 26 is illustrated other types of wire connectors may be filled with a heated premixed silicone gel. In addition the method may be used for injecting damping materials into wire connectors or other devices.

Thus, the method includes injecting a heated mixed silicone gel precursor 27 into a cavity 26a of wire connector 26 to form a silicone gel in a wire connector where the gel therein remains in an unseparated state therein. To heat the gel precursors one may direct a first gel precursor at room temperature through a heat transfer member maintained at a temperature in the range of about 45 C to 65 C at a flow rate that allows the first gel precursor to approach the temperature of the heat transfer member as the first gel precursor exits the heat transfer member and may also direct a second gel precursor at room temperature through a separate heat transfer member also maintained at a temperature in the range of about 45 C to 65 C at a flow rate that allows the second gel precursor to approach the temperature of the second heat transfer member as the second gel precursor exits the separate heat transfer member. One then mixes the first gel precursor, which is at a temperature approaching the temperature of the first heat transfer member, with the second gel precursor, which is at a temperature approaching the temperature of the second heat transfer member to form a heated mixed gel precursor in a chamber 23a of the dispensing valve 23 where the temperature of both gels before mixture are the same or about the same. Next, one dispenses the heated mixed gel precursor 27 into a cavity of a wire connector 26 and cures the mixed gel precursor without heating the wire connector, which is at room temperature, to produce a gel containing wire connector 26 wherein the gel in the wire connector remains in an unseparated state during the shelf life of the gel. It has been found that the method provides a cured gel that remain in an unseparated state i.e. no oily film if each of the gel precursors are heated sufficiently so that when the heated gel precursors are mixed they form a single heated mixed gel precursor that can be placed in a wire connector that need not be heated thereby eliminating a step of having to heat the wire connector to cure the gel. Although there is no bright line a temperature range of about 45° C. to 65° C. has been found an effective range for heating the gel precursors to enable formation of gel in a wire connector that remains in an unseparated state. Similarly, while no bright line a minimum temperature of about 25° C. above room temperature has been found effective for heating the gel precursors to enable formation of gel in a wire connector that remains in an unseparated state.

A feature of the manufacturing process using system 10 is that it allows one to store two separate gel precursors at room temperature (typically about 20 degrees C.) and then in an on-the-go process temporarily heat the two separate gel precursors as they flow to a dispensing valve 23 which eliminates the need to heat the entire gel precursors. In the present manufacturing process neither the dispensing valve 23 or the wire connectors 26 require heating to cure the gel in the wire connector thus eliminating the need for additional heating and at the same time avoiding gel separation that can occur with conventional curing that may render the wire connector unsuitable for use.

With the method of the invention one can inject mixed silicone gel precursors into a cavity of an empty wire connector 26 to form a silicone gel 27 wherein the gel therein remains in an unseparated state. Typically, the gel separation with conventional curing of silicone gel has been found to be more pronounced when the charge of dispensed gel is small. While there is no abrupt transition as to the size of the charge where gel separation occurs generally a more noticeable separation occurs when the charge is about 10 grams or less.

The method includes directing the first gel precursor at the room temperature through a heat transfer member 20 which is maintained at a temperature in the range of about 45 C to 65 C at a rate that allows the first gel precursor to approach the temperature of the heat transfer member. Similarly, directing the second gel precursor at room temperature through a separate heat transfer member 21 maintained at a temperature in the range of about 45 C to 65 C at a rate that allows the second gel precursor to approach the temperature of the second heat transfer member. While the gel precursor are heated on the go as the gel precursor are transferred to a dispensing valve it is envisioned that other methods of heating the gel precursors prior to mixing the gel precursors may be used.

Thus the process of manufacturing a gel filled wire connector includes the steps of heating the gel precursors to the proper temperature and mixing the first gel precursor at a temperature approaching the temperature of the first heat transfer member 20 with the second gel precursor at the temperature approaching the temperature of the second heat transfer member 21 to form a heated mixed gel precursor 27 in a dispensing valve 23. One can then dispense the heated mixed gel precursor 27 into a cavity 26a of a wire connector 26 and then carry the wire connector with the mixed gel precursor to a storage bin for completion of the curing during the preparation of the product for shipping.

Once dispensed therein one can allow the heated mixed gel precursor to self cure at room temperature without additional heat to thereby produce a gel containing wire connector wherein the gel 27 in the wire connector remains in an unseparated state during the shelf life of the gel. While the gel precursors are mixed in an unheated needle nozzle 24 in some instances one may want to heat the needle nozzle.

While the cause of the gel separation is not fully understood the invention herein provides a method and apparatus for eliminating the undesirable separation of cured silicone gels in wire connectors.

We claim:

1. A method of manufacturing gel filled wire connectors without an isolated cure stage comprising;
    directing a first gel precursor at a room temperature through a heat transfer member maintained at a temperature in the range of about 45 C to 65 C at a flow rate that allows the first gel precursor to approach the temperature of the heat transfer member as the first gel precursor exits the heat transfer member;
    directing a second gel precursor at room temperature through a separate heat transfer member maintained at a temperature in the range of about 45 C to 65 C at a flow rate that allows the second gel precursor to approach the temperature of the second heat transfer member as the second gel precursor exits the separate heat transfer member;
    mixing the first gel precursor at a temperature approaching the temperature of the first heat transfer member with the second gel precursor at the temperature approaching the temperature of the second heat transfer member to form a mixed gel precursor;
    dispensing the mixed gel precursor into a cavity of a wire connector; and
    curing the mixed gel precursor at room temperature to produce a gel containing wire connector wherein the gel in the wire connector remains in an unseparated state during the shelf life of the gel.

2. The method of claim 1 wherein the amount of the mixed gel precursor injected into the cavity of the wire connector is less than 10 grams.

3. The method of claim 1 wherein the first heat transfer member comprises a heated hose and the second heat transfer member comprises a heated hose.

4. The method of claim 1 wherein the mixed gel precursor is dispensed into the cavity of a twist on wire connector.

5. The method of claim 1 wherein the mixing of the first gel precursor at a temperature approaching the temperature of the first heat transfer member with the second gel precursor at the temperature approaching the temperature of the second heat transfer member where a temperature of the first gel precursor and a temperature of the second gel precursor prior to mixing are about the same and the mixing occurs in a dispensing end of a needle nozzle.

6. The method of claim 1 wherein the temperature of the wire connector is at room temperature when the mixed gel precursor is dispensed therein.

7. The method of claim 1 wherein the silicone gel is selected from a group of gels wherein a cure temperature of the mixed gel ranges from 25 degrees C. to 150 degrees C.

8. The method of claim 1 wherein the temperature of the wire connector is at room temperature prior to injection of the mixed gel precursor therein.

9. The method of claim 8 wherein the amount of mixed gel precursor dispensed into the cavity of a twist on wire connector is less than 10 grams.

10. The method of claim 9 wherein the mixing of the first gel precursor and the second gel precursor occurs in an unheated needle nozzle.

11. A method of manufacturing a gel containing wire connector by injecting at least two silicone gel precursors into a cavity of an empty wire connector to form a silicone gel that remains in an unseparated state therein comprising;
    heating a first gel precursor to a temperature above room temperature;
    heating a second gel precursor to a temperature above room temperature;
    mixing the first gel precursor with the second gel precursor to form a heated mixed gel precursor while the first gel precursor and the second gel precursor are in a heated condition;
    dispensing the heated mixed gel precursor into a cavity of a wire connector; and curing the mixed gel precursor at room temperature to produce a gel containing wire connector.

12. The method of claim 11 including the step of storing the first gel precursor and the second gel precursor at room temperature and heating the first gel precursor and the second gel precursor to a temperature in the range of about at least 25 C and the mixing the first gel precursor with the second gel precursor to form a heated mixed gel precursor while the first gel precursor and the second gel precursor are in a heated condition occurs in a nozzle.

13. The method of claim 12 including the step of on-the-go raising the temperature of the first gel precursor and the second gel precursor as the first gel precursor and the second gel precursor flow to a dispensing valve.

14. The method of claim 13 including the step of directing a wire connector at room temperature to a position to receive the mixed gel precursor to enable the mixed gel precursor to cool and cure in the cavity of the wire connector.

15. The method of claim 14 including the step of only elevating the temperature of the first gel precursor and the second gel precursor while the first gel precursor and the second gel precursor are in an unmixed state and allowing the mixed gel precursor to cool from a mixed gel precursor state to room temperature during a cure cycle and the amount of mixed gel precursor dispensed into the wire is less than 10 grams of the mixed gel precursor.

* * * * *